United States Patent Office 3,695,877

Patented Oct. 3, 1972

3,695,877

PHOTOPOLYMERIZABLE RESIN COMPOSITIONS

Yasuo Taneda, Kiyomi Naka, and Akihiro Horike, Tokyo, Japan, assignors to Teijin Limited, Osaka, Japan No Drawing. Filed Aug. 10, 1970, Ser. No. 62,643
Claims priority, application Japan, Aug. 13, 1969, 44/64,059
Int. Cl. G03c *1/68*
U.S. Cl. 96—35.1 10 Claims

ABSTRACT OF THE DISCLOSURE

Photopolymerizable resin compositions composed essentially of unsaturated polyester, crosslinking agent and optical sensitizer, which is characterized in that said unsaturated polyester is a carboxyl group-containing unsaturated polyester obtained by polycondensation of an acid component comprising:

(1)(a) At least 5 mol percent to the total acid component of aromatic polycarboxylic acid containing at least three carboxyl groups, or functional derivative thereof, (b) at least 30 mol percent to the total acid component of ethylenically unsaturated dicarboxylic acid or functional derivative thereof, and (c) zero to 50 mol percent to the total acid component of dicarboxylic acid containing no ethylenic unsaturation, or functional derivative thereof, and an alcoholic component composed substantially of (2) Aliphatic glycol.

The photopolymerizable resin compositions of the present invention exhibit excellent properties such as solvent resistance, strength, hardness and dimensional stability.

This invention relates to resin compositions which are polymerizable under the action of light. Particularly the invention relates to novel photopolymerizable resin compositions which are soluble in aqueous solvents before exposure, but polymerize by the action of actinic light and become insoluble in the aqueous solvents. From said compositions, relieves of excellent quality for relief printing can be produced.

Among the printing trade, method of making relief made of lead alloy for relief printing has been known of old as sterotype, and relief printing has been practiced using such relieves in most cases.

Although the method has an advantage of low production cost, it is subject to such drawbacks as that the product is heavy and difficult of handling, that there is a danger of lead poisoning, and that it requires processing under high temperatures. Thus improvement of the method is urgently desired.

On the other hand, the development in photocomposing machine caused increasing demand for photoengraving. However, no useful method for making relieves for relief printing from photograph film is known other than that using metal plate or photosensitive resin. For the preparation of such metal plate, etching process with acid is required, while pollutes the working atmosphere. Furthermore, the engraving requires a long time and the process control is cumbersome. Whereas, heretofore known photosetting resins are either extremely expensive, or lack the properties required of printing plate, e.g., solvent resistance, strength, hardness, dimensional stability, etc., and consequently have not yet been widely used on industrial scales, as substitute of sterotype.

The object of the present invention is to provide photosetting resin compositions for relieves in relief printing, which exhibit excellent properties such as solvent resistance, strength, hardness and dimensional stability. That is, the photosetting resin compositions of the invention can be used to form relieves of excellent printability by simple procedures comprising daubing the composition onto the support to form a photosensitive coating thereon, irradiating the coating with actinic light through negative film having image-bearing transparency, and removing the resin coating of the portions not exposed by dissolving the same with solvent.

It is necessary for the photopolymerizable resin compositions that they are soluble in aqueous solvent before the exposure. Because, if the non-exposed compositions are insoluble in aqueous solvent although soluble in organic solvent, it is disadvantageous both economically and to safety of the operation. Furthermore, working atmosphere may also be polluted. Again the polymerized portions of the resin layer after the exposure should have sufficient affinity with printing ink, and should not be swollen or altered by the organic solvent contained in the ink.

Furthermore, the polymerized resin must possess sufficient strength, hardness, and dimensional stability so as to eliminate the possible shear and distortion in printing.

Conventionally, the method of polymerizing unsaturated polyester and crosslinking agent under exposure to actinic light, in the presence of optical sensitizer, is well known.

Also the use of unsaturated polyester made of highly hydrophilic polyether glycol as a reactant, in the preparation of photo-polymerizing resin compositions which are soluble in aqueous solvent is known.

However, such hydrophilic polyester exhibits low hardness even after the polymerizing, and is apt to be deformed by external force, etc., although it does have elasticity, and therefore hardly provides clear printing.

We now discovered that, when aromatic polycarboxylic acid is used as the reactant of unsaturated polyester, photopolymerizing resin compositions of excellent hardness and dimensional stability and which is therefore valuable for the preparation of printing plate of high quality, can be obtained; and that particularly when aromatic carboxylic acid having at least three carboxyl groups, such as aromatic tri- or tetracarboxylic acids, is used for the preparation of unsaturated polyester under such conditions as will cause reaction of two carboxyl groups among the three or four carboxyl groups, leaving the rest unreacted at side chains of the polymer, starting unsaturated polyester which is soluble in aqueous solvent, particularly diluted aqueous alkali, can be obtained, said polyester providing photopolymerizable resin compositions of excellent combination of aforementioned properties.

Thus according to the present invention, photopolymerizing resin compositions composed of unsaturated polyester, crosslinking agent and optical sensitizer, which is characterized in that the unsaturated polyester is a carboxyl group-containing unsaturated polyester obtained by polycondensation of an acid component consisting of (1)(a) at least 5 mol percent to the total acid component of aromatic polycarboxylic acid having at least 3 carboxyl groups or functional derivative thereof,
(b) at least 30 mol percent to the total acid component of ethylenically unsaturated dicarboxylic acid or functional derivative thereof, and
(c) zero to 50 mol percent to the total acid component of dicarboxylic acid having no ethylenic unsaturation or functional derivative thereof;

with (2) an alcoholic component consisting substantially of aliphatic glycol is provided.

The aromatic polycarboxylic acid used for making the unsaturated polyester serving as a component of subject composition is a compound containing at least three carboxyl groups which are directly bonded with the aromatic nucleus. The aromatic nucleus is either aromatic hydrocarbon ring or aromatic heterocyclic ring, either of which optionally containing substituent groups which will not objectionally interfere with the preparation of polyester, aromatic hydrocarbon ring such as benzene and naphthalene nucleus being preferred.

As more specific examples of the compounds, the following may be named:

hemimellitic acid,
trimellitic acid,
trimesic acid,
2,4,5-toluenetricarboxylic acid,
1,3,5-trimethyl-2,4,6-benzenetricarboxylic acid,
pyromellitic acid,
1,2,4-naphthalenetricarboxylic acid,
1,4,8-naphthalenetricarboxylic acid,
1,4,5,8-naphthalenetetracarboxylic acid,
2,3,7-anthracenetricarboxylic acid,
2,3,7,8-anthracenetetracarboxylic acid,
triphenylmethanetricarboxylic acid,
pyridine-2,4,6-tricarboxylic acid,
2,3,5-pyridinetricarboxylic acid,
2,3,5,6-pyridinetetracarboxylic acid,
2,3,4-furanetricarboxylic acid,
2,3,4,5-furantetracarboxylic acid,
2,3,4-thiophenetricarboxylic acid,
2,3,4,5-thiophenetetracarboxylic acid, and
mixtures of the foregoing.

As the functional derivatives capable of forming polyester, anhydrides, lower alkyl esters of 1–4 carbons, or acid halides of those polycarboxylic acids may be used.

The preferred aromatic polycarboxylic acids and functional derivatives thereof are the carboxylic acids represented by the formula:

$$\underset{\substack{|\\(COOH)_n}}{HOOC-R_1-COOH} \qquad (I)$$

in which $R_1$ is benzene or naphthalene nucleus, and $n$ is 1 or 2, anhydrides, acid halides, and lower alkyl esters thereof. The most preferred compounds are trimesic acid, trimellitic anhydride and pyromellitic anhydride.

In the preparation of unsaturated polyester to be employed in the subject compositions, as a copolymerizing component with the above polycarboxylic acid, unsaturated dicarboxylic acid containing at least one ethylenic carbon-to-carbon double bond or a functional derivative thereof is used. As such ethylenically unsaturated dicarboxylic acid or functional derivatives thereof, dicarboxylic acid of the formula:

$$HOOC-R_2-COOH \qquad (II)$$

in which $R_2$ is an aliphatic hydrocarbon radical of 2–6 carbons containing at least one carbon-to-carbon double bond, anhydrides, acid halides, and lower alkyl esters thereof, are preferred.

Specific examples of suitable ethylenically unsaturated dicarboxylic acids and functional derivatives thereof include maleic anhydride, fumaric acid, itaconic anhydride, citraconic anhydride, and muconic acid.

It is important for the unsaturated polyester to be soluble in aqueous solvent before hardening and to exhibit the combination of suitable mechanical properties such as strength, hardness and toughness and solvent resistance when hardened, that the afore-described aromatic polycarboxylic acid should be present in an amount of at least 5 mol percent, particularly 10–50 mol percent, to the total of acid component. Also for the composition to exhibit the strength and hardness suitable for printing plate and not to be swollen by water and organic solvents after it is polymerized under exposure, the unsaturated dicarboxylic acid should be used in the amount of at least 30 mol percent, preferably 50–90 mol percent, to the total acid component.

In order to improve various properties of the compositions of this invention, dicarboxylic acid containing no ethylenically unsaturated radical can be used besides the foregoing two constituents of the acid component. As such dicarboxylic acid, for example, those represented by the formula:

$$HOOC-R_4-COOH \qquad (III)$$

in which $R_4$ is a divalent hydrocarbon radical of 2–10 carbons containing no ethylenic unsaturation or functional derivatives thereof can be used in an amount not exceeding 50 mol percent, preferably 0–40 mol percent, to the total acid component. Preferred dicarboxylic acids and derivatives thereof include phthalic acid, isophthalic acid, terephthalic acid, naphthalenedicarboxylic acid, succinic acid, adipic acid, sebacic acid, and anhydrides, lower alkyl ester, and acid halides of the foregoing.

As the alcoholic component of unsaturated polyester, any of aliphatic glycols can be used, the normally preferred glycols being those represented by the formula:

$$HO(R_3O)_mH \qquad (IV)$$

in which $R_3$ is an alkylene radical of 2–4 carbons, and $m$ is an integer of 1–4. Suitable specific glycols are, for example, saturated aliphatic glycols such as ethylene glycol, propylene glycol, trimethylene glycol, tetramethylene glycol, diethyl glycol, and triethylene glycol; and unsaturated aliphatic glycols such as butenediol, glycerin monoacrylate, and pentaerythritol diacrylate, etc.

The alcoholic component may contain, besides the above aliphatic alcohols, minor amount of, for example, up to 5 mol percent to the total alcoholic component of, polyhydric alcohol such as glycerin, trimethylolpropane, pentaerythritol, sorbitol, etc., or aromatic glycol such as o-, m- or p-xylylene glycol.

Besides the foregoing constituents of acid component and alcoholic component, a minor amount of, for example, up to 20 mol percent of, hydroxycarboxylic acid such as $\beta$-hydroxyethylbenzoic acid, $\epsilon$-hydroxycaproic acid, $\beta$-hydroxyethoxybenzoic acid, or functional derivatives thereof, may be used for the purpose of qualitative improvement.

The unsaturated polyester employed in the invention can be formed by polycondensation of above-specified acid component with the alcoholic component and optionally with the minor amount of hydroxycarboxylic acid, in such a manner that a part of the carboxyl groups directly bonded with aromatic ring should remain in the produced unsaturated polyester as side chains. This can be achieved by performing the polycondensation while maintaining the mol ratio of acid component to alcoholic component approximately at 10:7 to 10:10.

Other polycondensation conditions are similar to those known and conventionally employed. For example, if the acid component is carboxylic acid or anhydride thereof, conveniently the acid component together with the alcoholic component is heat-melted at 100–200° C. under atmospheric pressure to cause their polycondensation. The reaction progresses very smoothly and normally completes within 2–10 hours, even in the absence of catalyst.

When lower alkyl ester is used as the acid component, the polycondensation can be performed at 120–200° C., in the presence of ester-interchange catalyst known per se. Also if acid halide is used as the acid component, the polycondensation can be performed at relatively low temperatures, for example, 20–100° C., using acid acceptor.

When the reactivities of plural constituents of acid component and/or alcoholic component are different, conveniently the slow-reacting constituent(s) is (are) first added to the reaction system, subsequently successfully adding the other constituents by the order of their reactivities to perform the condensation stepwisely.

The preferred unsaturated polyester employed in this invention consists essentially of (A) The recurring unit of the formula $$\left[ -\underset{\displaystyle (COOH)_n}{R_1}-\underset{\displaystyle \|\atop O}{C}O-\left(R_3O\right)_m-\underset{\displaystyle \|\atop O}{C}- \right]$$

in which $R_1$ is a benzene or naphthalene nucleus; $n$ is 1 or 2; $R_3$ is an alkylene radical of 2–4 carbons, and $m$ is an integer of 1–4, (B) The recurring unit of the formula $$\left[ -R_2-\underset{\displaystyle \|\atop O}{C}-O(R_3O)_m-\underset{\displaystyle \|\atop O}{C}- \right]$$

in which $R_3$ and $m$ have the significations as defined above, and $R_2$ is an aliphatic hydrocarbon radical of 2–6 carbons containing at least one carbon-to-carbon double bond, and (C) The recurring unit of the formula $$\left[ -R_4-\underset{\displaystyle \|\atop O}{C}-O(R_3O)_m-\underset{\displaystyle \|\atop O}{C}- \right]$$

in which $R_3$ and $m$ have the significations as defined above, and $R_4$ is a divalent hydrocarbon radical of 2 to 10 carbons containing no ethylenic unsaturation;

The recurring unit (A) occupying 10–50 mol percent of the total recurring units, the unit (B) occupying 50–90 mol percent, and the unit (C), 0–40 mol percent.

Surprisingly it is discovered that, although the unsaturated polyester contains tribasic or tetrabasic carboxylic acid as the acid component, it still is substantially linear, exhibiting excellent miscibility with the crosslinking agent, and being easily soluble in aqueous solvent. Normally preferred molecular weight of the unsaturated polyester ranges from 500 to 5,000.

Normally the residual carboxyl group content of polyester is expressed by acid value. The unsaturated polyesters employed in the invention possess relatively large acid values comparing with those of known unsaturated polyesters, e.g., normally at least 100, preferably 130–300.

The unsaturated polyester is used in the quantity ranging from 45 to 95% by weight, particularly 50 to 80% by weight, to the total weight of the composition.

As the crosslinking agent, polymerizable compound containing at least one ethylenic carbon-to-carbon double bond in its molecule is used, to promote the crosslinking reaction of the unsaturated polyester and furthermore to provide hardened product of high strength and hardness. Obviously, such ethylenically unsaturated monomer must be miscible with the above-described unsaturated polyester. As such compounds, for example, styrene, α-methylstyrene, vinyltoluene, acrylic acid, methacrylic acid, acrylate, methacrylate, acrylamide, methacrylamide, ethylene glycol diacrylate or dimethacrylate, di-, tri- or tetraethylene glycol diacrylate or dimethacrylate, methylene-bis (acrylamide), ethylene glycol bis (allylcarbonate), diallyl phthalate etc. may be named:

It is desirable that the ethylenically unsaturated monomer serving as the crosslinking agent is soluble in aqueous solvent, but such is not essential.

Those crosslinking agents are preferably used within the quantitative range of 5–60% to the total weight of the composition. When the amount of crosslinking agent is less than the lower limit, the rate of crosslinking reaction is low, and strength of the composition after being hardened is reduced. Whereas, if the amount exceeds 60%, not only the composition's solvent resistance after the hardening is deteriorated, but also the hardened resin is brittle, although it does exhibit high hardness.

Addition of optical sensitizer is essential to cause the progress of hardening reaction between the unsaturated polyester and crosslinking agent at sufficiently high speed. As the optical sensitizer, known compounds in the field can be effectively employed. For example, benzoins such as benzoin, benzoin-methyl or ethyl ether; benzophenones such as benzophenone, P,P′-N,N,N′,N′-tetramethylamino-benzophenone; anthraquinones such as 9,10-anthraquinone, 2-methyl anthraquinone, etc.; benzil, and biacetyl can be used.

Suitable amount of the optical sensitizer ranges, to the total weight of the composition, 0.001–10%. If less than 0.001% of optical sensitizer is used, the photo-setting reaction is retarded and long exposure time is required. Whereas, when more than the upper limit of the sensitizer is used, for example mechanical strength, storage stability, etc. of the hardened compositions are deteriorated.

For increasing the storage stability of the subject compositions, known thermal polymerization inhibitor may be blended. As the thermal polymerization inhibitor, for example, phenols, hydroquinones, catechols, picric acids, are useful. Normally preferred amount of the inhibitor range 0.001–1.0%, to the total weight of the composition.

The subject composition is used for the preparation of printing plate in the following manner, i.e., the composition is caused to form a layer of 0.1 to several millimeters in thickness on the supporter which may be a metallic sheet of iron, stainless steel, zinc, aluminium, etc.; rubber sheet of natural or synthetic rubber; or film of celluloid, polyethylene, polypropylene, polyethylene terephthalate, etc.

The layer is preferably adhered to the supporter through a thin layer of an adhesive. Then a negative film having image-bearing transparency is placed on the layer, and light of 200–700 mμ in wave length is irradiated thereon to cause hardening of the resin composition.

The exposure time normally ranges from 1 to ten and several minutes, whereupon forming very tough, hard layer. The unexposed portions corresponding to the blank portions of the negative film are dissolved and removed by aqueous solvent (particularly aqueous alkali).

Suitable aqueous solvents are diluted aqueous solutions of caustic soda, caustic potash, ammonia, etc. which can wash off the unhardened portions from the surface of the resin layer normally within several minutes.

Thus obtained hardened resin with relief can be used as the printing plate as it is, upon mounting the same on the printing machine.

When the subject composition is hardened by light, it comes to possess a strength of at least 800 kg./cm.$^2$, Shore hardness (A) of at least 80, excellent dimensional stability, and good swelling resistance against the organic solvents contained in printing ink, such as acetate, alcohol, acetone, benzene, toluene, etc. Thus the printing plate made of the composition is capable of faithfully reproducing fine and complex pictures and lines, and therefore is extremely useful for precision printing and color printing.

The plate also exhibits excellent affinity with printing ink, and ink-transfer ability to paper, polyethylene, etc.

The photosetting resin compositions of the invention can be used for wide range of utilities besides the printing plate, such as paint, adhesive, display, lens, photo-resisting agent, etc.

Hereinafter the invention is illustrated in greater detail by the following examples, in which parts are by weight unless otherwise specified. Also the acid value denotes the milligram number of KOH required for neutralizing the acid radical contained in 1 g. of the polymer.

EXAMPLE 1

An unsaturated polyester was prepared by reacting 192 parts of trimellitic anhydride, 98 parts of maleic anhydride, and 62 parts of ethylene glycol for 30 minutes at 100–120° C., and for 2 hours at 180° C. The unsaturated polyester had a molecular weight of 820 and an acid value of 280.

Seventy (70) parts of this unsaturated polyester was thoroughly mixed with 30 parts of acrylamide, 0.01 part of hydroquinone, 0.7 part of benzoin and 20 parts of acetone, to form an acetone solution of photopolymerizable resin composition.

The composition was daubed on a 0.5 mm. thick aluminum sheet, which was subsequently allowed to stand in a dark room for 72 hours at room temperature to cause evaporation of the solvent. Thus, an approximately 1-mm. thick printing plate of photo-setting resin composition having smooth surfaces was obtained. Negative film with transparent linear patterns was intimately contacted with the photo-sensitive layer of the plate, and exposed to ultraviolet rays supplied from a 450-w. high pressure mercury lamp, for approximately 2 minutes. Then the plate was washed with 0.1% aqueous solution of caustic soda for approximately 5 minutes. Thus a relief from which the unexposed portions were removed was obtained. The exposed portions had a Shore hardness (A) of 98. When the plate was used for printing on paper using typographical ink, very clear printed matter was obtained, exhibiting excellent ink-transfer ability comparing with that of conventional lead alloy printing plate.

EXAMPLE 2

Thirty-one (31) parts of isophthalic acid, 70 parts of fumaric acid, and 60 parts of ethylene glycol were reacted at the highest temperatures ranging from 180 to 190° C. for approximately 5 hours. In the meantime, approximately 26 parts of water was distilled off. The product was cooled 100° C., and 38 parts of trimellitic anhydride was added thereto, followed by agitation at 100° C. for approximately 30 minutes to cause complete dissolving of the anhydride. Then the product was again heated to 180° C. and reacted for additional two hours.

Thus produced unsaturated polyester had a molecular weight of 1550, and an acid value of 179.

To the polyester then 0.1 part of hydroquinone, 115 parts of styrene and 4 parts of benzoin methyl ether were added, and thoroughly mixed at approximately 60° C. Then the composition was daubed onto a steel sheet to the thickness of approximately 1 mm. and cooled, forming a photopolymerizable resin printing plate.

The plate being exposed to ultraviolet rays in the manner similar to Example 1, a hard printing relief having a strength of 300 kg./cm.$^2$ and Shore hardness (A) of 95 was obtained.

EXAMPLE 3

An ester-interchange reaction was performed among 38.8 parts of dimethyl terephthalate, 53 parts of diethylene glycol, 38 parts of propylene glycol, and 0.003 part of zinc acetate, at 180–200° C. for 3 hours, causing distillation of methanol.

Then the product was cooled to 100° C., and to which 72.6 parts of 1,4,8-naphthalenetricarboxylic acid anhydride and 56 parts of citraconic anhydride were added, followed by an additional hour's reaction at 120–140° C. and 2 hours' reaction at 180° C., to form an unsaturated polyester.

The polyester had a molecular weight of 1200, and an acid value of 140.

A printing plate was prepared similarly to Example 1, except that the above unsaturated polyester was used in place of the polyester prepared in Example 1. After exposure, the polymerized resin had a strength of 450 kg./cm.$^2$, and a Shore hardness (A) of 85.

EXAMPLE 4

An unsaturated polyester having a molecular weight of 920, and an acid value of 150 was produced by reacting 29.6 parts of phthalic anhydride, 42 parts of trimesic acid, 60.8 parts of maleic anhydride, 18.6 parts of ethylene glycol and 53.2 parts of 1,2-propylene glycol, at 170–180° C., for 5 hours. This polyester was cooled to 60° C., and thoroughly mixed with 0.1 part of 2,6-di-t-butyl-p-cresol, 79 parts of triethylene glycol diacrylate, 26 parts of diallyl phthalate, and 0.1 part of 9,10-anthraquinone.

The composition was evenly coated on transparent glass sheet to a thickness of approximately 0.5 mm., and exposed to ultraviolet rays similarly to Example 1. Thus an excellent printing plate having a Shore hardness (A) of 82 was obtained.

EXAMPLE 5

343 parts of maleic anhydride and 310 parts of ethylene glycol were heated at 180–190° C. for 5 hours, distilling off 55 parts of water. Then the product was cooled to 100° C., and to which 327 parts of pyromellitic anhydride was added, followed by an hour's reaction at 110° C., and another hour's reaction at 120° C. to form an unsaturated polyester.

This polyester had a molecular weight of 2,050, and an acid value of 110.

The polyester was dissolved by addition thereto of 300 parts of tetrahydrofuran containing 0.5 part of hydroquinone, forming a solution having a concentration of 75% and viscosity of 270 poise (at 30° C.). A photopolymerizable resin composition was made of the solution by adding thereto 170 parts of methylene-bis-acrylamide and 8 parts of benzoin methyl ether, which was subsequently formed into a printing plate similarly to Example 1. Thus a hard relief having a strength of 400 kg./cm.$^2$, and a Shore hardness (A) of 100 was obtained.

EXAMPLE 6

A mixture of 84.2 parts of anhydrous trimellitic acid chloride, 244.8 parts of fumaric acid dichloride, 212 parts of diethylene glycol, and 370 parts of triethylamine, was reacted for 2 hours at 40° C., and for additional 2 hours at 100–120° C. The reaction mixture was in the form of slurry, which was filtered at elevated pressures of 4–5 kg./cm.$^2$ at 100° C. Thus as the filtrate, an unsaturated polyester having a molecular weight of 1,100 and an acid value of 135 was obtained.

Fifty-five (55) parts of this unsaturated polyester was thoroughly mixed with 15 parts of acrylamide, 30 parts of diethylene glycol diacrylate, 0.02 part of hydroquinone, and 0.3 part of benzoin methyl ether, to form a photopolymerizable resin composition.

The composition was daubed on 0.3 mm. thick steel sheet to a thickness of 0.8 mm., and with that coating layer negative film having image-bearing transparency was intimately contacted through a thin cover film. After 4 minutes' exposure to ultraviolet ray from fluorescent lamp, the coating was washed with 0.3% aqueous sodium carbonate solution for 3 minutes, thus providing a relief printing plate having a Shore hardness (A) of 95, and a strength of 400 kg./cm.$^2$.

EXAMPLE 7

Ninety-one (91) parts of itaconic acid, 57.6 parts of trimellitic anhydride, and 95.4 parts of diethylene glycol were reacted for approximately 4 hours at 170–180° C. During the reaction, approximately 24 parts of water was distilled off. Thus obtained unsaturated polyester had a molecular weight of 879, and an acid value of 165.

To 180 parts of this unsaturated polyester, 0.03 part of methoxyhydroquinone, 75 parts of tetramethylene glycol diacrylate, 45 parts of acrylamide, and 0.9 part of benzoin methyl ether were added, and the system was thoroughly mixed at approximately 60° C. to provide a photopolymerizable resin composition.

The composition was daubed onto a 0.3-mm. thick steel sheet to a thickness of approximately 0.7 mm., forming a photo-polymerizable resin printing plate.

When the plate was exposed and washed similarly to Example 6, an excellent relief printing plate having a strength of 290 kg./cm.$^2$ and a Shore hardness (A) of 94 was obtained.

EXAMPLE 8

A mixture of 78.4 parts of maleic anhydride, 38.4 parts of trimellitic anhydride, 117 parts of dipropylene glycol, and 3.7 parts of p-xylene glycol, was reacted for approximately 3.5 hours at 175–180° C. Thus obtained unsaturated polyester had a molecular weight of 900, and an acid value of 140.

The polyester was used in the preparation of relief printing plate similarly to Example 6, which had a strength of 310 kg./cm.$^2$ and a Shore hardness (A) of 100. The plate also exhibited favorable properties for printing plate.

EXAMPLE 9

A mixture composed of 78.4 parts of maleic anhydride, 38.4 parts of trimellitic anhydride, 84.4 parts of diethylene glycol, and 264 parts of hydroxycaproic acid, was reacted for approximately 4 hours at 175–185° C. Thus obtained unsaturated polyester had a molecular weight of 879 and an acid value of 165.

The polyester was used in the preparation of a photopolymerizable resin composition and further a relief printing plate therefrom, similarly to Example 7. The plate exhibited excellent printability.

Control 1

A mixture of 158 parts of tricarballylic anhydride, 98 parts of maleic anhydride, and 124 parts of ethylene glycol was reacted at 100–130° C. for 30 minutes, and further for 2 hours at 180° C. to form an unsaturated polyester. The polyester had a molecular weight of 750 and an acid value of 270.

A relief printing plate was prepared similarly to Example 1, except that the unsaturated polyester therein was replaced by the above-prepared polyester. The polymerized portion had a Shore hardness (A) of 60. When the plate was used in printing, smearing of strokes was observed, and clear printing could not be obtained.

Control 2

Ninety-six (96) parts of trimellitic anhydride, 98 parts of maleic anhydride, and 207 parts of xylylene glycol were reacted 100–120° C. for 30 minutes, and for subsequent 4 hours at 170° C. to form an unsaturated polyester.

The polyester had an acid value of 140 and a molecular weight of 1,600. This practice is outside the scope of this invention since xylylene glycol is not an aliphatic glycol.

Seventy (70) parts of this unsaturated polyester was mixed with 30 parts of styrene, 0.05 part of hydroquinone, 2 parts of benzoin and 20 parts of tetrahydrofuran, to form a photo-polymerizable resin solution. A relief printing plate prepared from this solution similarly to Example 1 had a sufficient hardness after hardening, i.e., a Shore hardness (A) of 100, but was too brittle to be used as a printing plate.

Control 3

A mixture of 15.4 parts of trimellitic anhydride, 188.2 parts of maleic anhydride, and 152 parts of propylene glycol was reacted similarly to Example 1, to form an unsaturated polyester having a molecular weight of 1,850 and an acid value of 85. In the above practice the amount of trimellitic anhydride was 4 mol percent to the total acid component, less than the lower limit specified in this invention.

A relief printing plate was prepared similarly to Example 1, except that the above-obtained unsaturated polyester was used as a component. However, the elusion of resin at the unexposed portions was insufficient and the degree of unsharpness appeared, showing low resolving power.

Control 4

Using the unsaturated polyester prepared in Example 2, the following A and B photopolymerizable resin compositions were prepared.

| Composition A: | Parts |
|---|---|
| Unsaturated polyester | 35 |
| Hydroquinone | 0.02 |
| Styrene | 65 |
| Benzoin methyl ether | 0.3 |
| **Composition B:** | |
| Unsaturated polyester | 97 |
| Hydroquinone | 0.02 |
| Styrene | 3 |
| Benzoin methyl ether | 0.3 |

The quantitative ratios of the components in both of the above compositions A and B are outside of the subject invention.

The compositions were radiated with ultraviolet rays, and hardened products of the following properties were obtained. Both products were brittle or weak.

PROPERTIES OF THE RESIN COMPOSITIONS AFTER HARDENING

| | Strength (kg./cm.$^2$) | Elongation (percent) | Young's modulus (kg./cm.$^2$) | Shore hardness (A) |
|---|---|---|---|---|
| Composition: | | | | |
| A | 200 | 3 | 1,500 | 100 |
| B | 10 | 50 | 700 | 55 |

We claim:

1. A photopolymerizable resin composition for preparing a printing plate consisting essentially of an unsaturated polyester, a cross-linking agent and a photosensitizer, the improvement wherein said unsaturated polyester is a carboxylic group-containing unsaturated polyester having an acid value of at least 100, obtained by polycondensation of (1) an acid component comprising (a) 10 to 50 mol percent based on the total acid component of an aromatic polycarboxylic acid containing at least three carboxylic groups directly bonded to the aromatic ring, or a functional derivative thereof selected from the group consisting of anhydrides, acid halides and lower alkyl esters, (b) 50 to 90 mol percent based on the total acid component of an ethylenically unsaturated dicarboxylic acid, or a functional derivative thereof selected from the group consisting of anhydrides, acid halides and lower alkyl esters, and (c) 0 to 40 mol percent based on the total acid component of a dicarboxylic acid containing no ethylenic unsaturation, or a functional derivative thereof selected from the group consisting of anhydrides, acid halides and lower alkyl esters; and (2) an alcoholic component consisting essentially of an aliphatic glycol, the mol ratio of said acid component (1) to said alcoholic component (2) being within the range of about 10:7 to about 10:10.

2. The composition of claim 1 wherein said aromatic polycarboxylic acid or functional derivative thereof is a carboxylic acid of the formula $$HOOC-\underset{\substack{|\\(COOH)_n}}{R_1}-COOH$$

wherein $R_1$ is a benzene ring or naphthalene ring, and $n$ is 1 or 2, or an anhydride, acid halide, or lower alkyl ester thereof.

3. The composition of claim 2 wherein said aromatic polycarboxylic acid or functional derivative thereof is trimesic acid, trimellitic anhydride, or pyromellitic anhydride.

4. The composition of claim 1 wherein said ethylenically unsaturated dicarboxylic acid or functional derivative thereof is a dicarboxylic acid of the formula $$HOOC—R_2—COOH$$

wherein $R_2$ is an aliphatic hydrocarbon radical of 2 to 6 carbon atoms, containing at least one carbon-to-carbon double bond or an anhydride, acid halide, or lower alkyl ester thereof.

5. The composition of claim 1 wherein said ethylenically unsaturated dicarboxylic acid is maleic anhydride, fumaric acid, or itaconic acid.

6. The composition of claim 1 wherein said aliphatic glycol is represented by the formula $$HO(R_3O)_mH$$

wherein $R_3$ is an alkylene group of 2 to 4 carbon atoms and $m$ is an integer of 1 to 4.

7. The composition of claim 1 wherein said unsaturated polyester consists of substantially of (A) the recurring unit of the formula

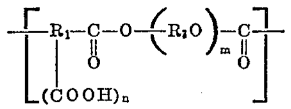

wherein $R_1$ is a benzene ring or naphthalene ring, $n$ is 1 or 2, $R_3$ is an alkylene group of 2 to 4 carbon atoms, and $m$ is an integer of 1 to 4;

(B) the recurring unit of the formula

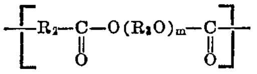

wherein $R_3$ and $m$ are as defined above, and $R_2$ is an aliphatic hydrocarbon radical of 2 to 6 carbon atoms, containing at least one carbon-to-carbon double bond; and (C) the recurring unit of the formula

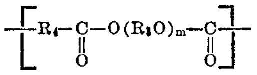

wherein $R_3$ and $m$ are as defined above, and $R_4$ is a divalent hydrocarbon of 2 to 10 carbon atoms, containing no ethylenic unsaturation;

the quantity of recurring unit (A) ranging from 10 to 50 mol percent, that of the recurring unit (B), 50 to 90 mol percent, and that of the recurring unit (C), 0 to 40 mol percent, based on the total recurring units.

8. The composition of claim 1 wherein the molecular weight of the unsaturated polyester is within the range of 500 to 5,000, and its acid value is at least 100.

9. The composition of claim 1 wherein said unsaturated polyester comprises 45 to 95% by weight based on the total composition.

10. In a process for the preparation of printing plates which comprises applying a layer of photopolymerizable resin composition consisting essentially of an unsaturated polyester, cross-linking agent, and optical sensitizer, on a support, placing a negative film having image bearing transparency on said layer, exposing said layer to light of a wavelength of 200 to 700 m$\mu$ to harden the exposed portions of said resin composition, and removing the resin composition forming the unexposed portions of the layer by dissolving the same with an aqueous solvent, the improvement wherein said unsaturated polyester is a carboxyl group-containing unsaturated polyester obtained by polycondensation of (1) an acid component comprising
   (a) 10 to 50 mol percent based on the total acid component of an aromatic polycarboxylic acid containing at least three carboxylic groups directly bonded to the aromatic ring, or a functional derivative thereof selected from the group consisting of anhydrides, acid halides and lower alkyl esters,
   (b) 50 to 90 mol percent based on the total acid component of an ethylenically unsaturated dicarboxylic acid, or a functional derivative thereof selected from the group consisting of anhydrides, acid halides and lower alkyl esters, and
   (c) 0 to 40 mol percent based on the total acid component of a dicarboxylic acid containing no ethylenic unsaturation, or a functional derivative thereof selected from the group consisting of anhydrides, acid halides and lower alkyl esters; and (2) an alcoholic component consisting essentially of an aliphatic glycol, the mol ratio of said acid component (1) to said alcoholic component (2) being within the range of about 10:7 to about 10:10.

References Cited

UNITED STATES PATENTS

| | | | |
|---|---|---|---|
| 2,949,361 | 8/1960 | Agens | 96—35.1 X |
| 3,031,301 | 4/1962 | Agens | 96—115 X |
| 3,255,006 | 6/1966 | Bailey | 96—115 X |
| 3,556,791 | 1/1971 | Suzuki | 96—35.1 |

RONALD H. SMITH, Primary Examiner

U.S. Cl. X.R.

96—115 R, 115 P